United States Patent [19]
Lee

[11] Patent Number: 5,179,292
[45] Date of Patent: Jan. 12, 1993

[54] CMOS CURRENT STEERING CIRCUIT

[75] Inventor: Man S. Lee, San Mateo, Calif.

[73] Assignee: Acumos, Inc., Foster City, Calif.

[21] Appl. No.: 894,476

[22] Filed: Jun. 5, 1992

[51] Int. Cl.$^5$ .................... H03K 5/22; H03K 5/153
[52] U.S. Cl. ............................ 307/255; 307/355; 307/362
[58] Field of Search ............. 307/355, 360, 362, 255, 307/448, 468, 450, 279, 544, 571

[56] References Cited

U.S. PATENT DOCUMENTS

| | | | |
|---|---|---|---|
| 4,670,671 | 6/1987 | De Weck | 307/355 |
| 4,818,896 | 4/1989 | Cavanna | 307/355 |
| 5,084,633 | 1/1992 | Izadinia | 307/362 |

Primary Examiner—William L. Sikes
Assistant Examiner—Sinh Tran
Attorney, Agent, or Firm—Burns, Doane, Swecker & Mathis

[57] ABSTRACT

A CMOS circuit for steering current utilizing minimal power includes a first stage comprising a first powering transistor and a first idling transistor essentially in a parallel configuration and placed in series with a second stage comprising a second powering transistor and a second idling transistor also essentially in a parallel configuration. The circuit is configured to allow the first idling transistor to supply a substantially constant low level, idling current, and the first powering transistor to controllably supply a higher, powering current. The second stage serves to direct the electric current provided by the first stage. When powering current is not required, the circuit draws only the low idling current.

15 Claims, 2 Drawing Sheets

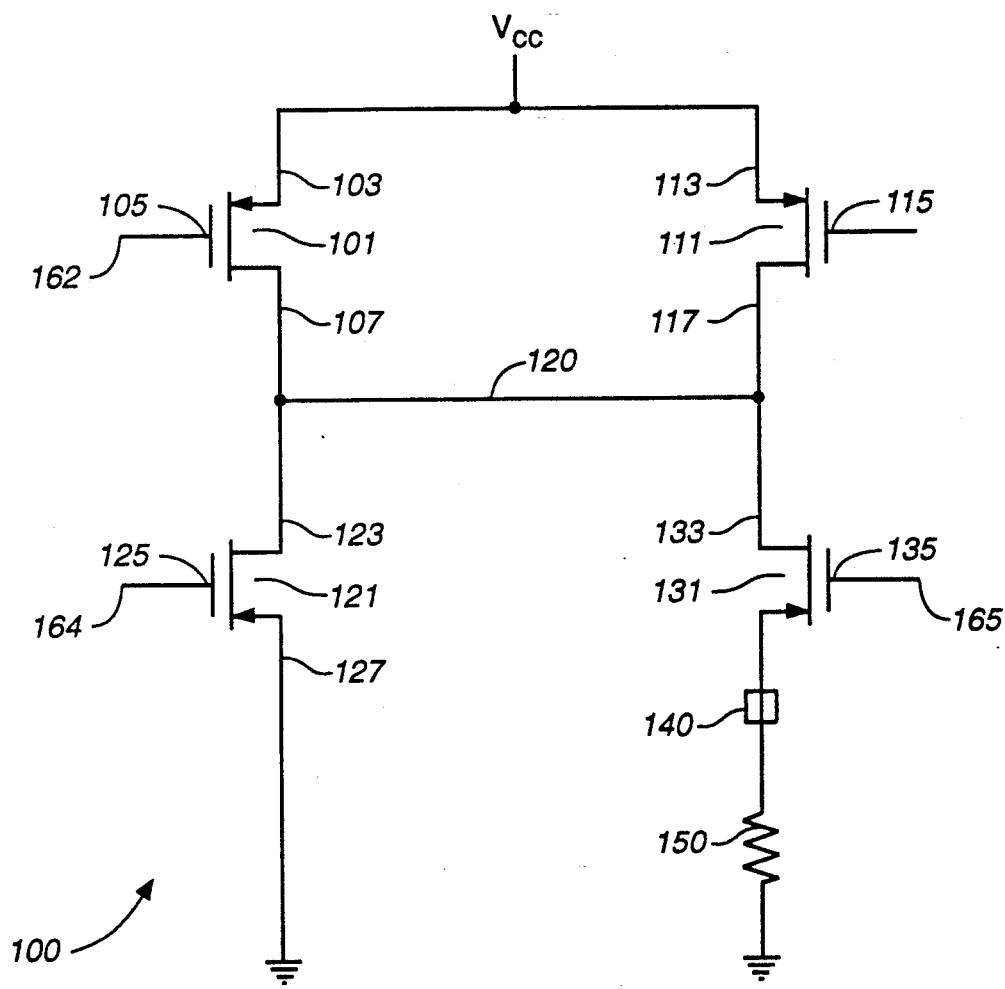
FIG._1

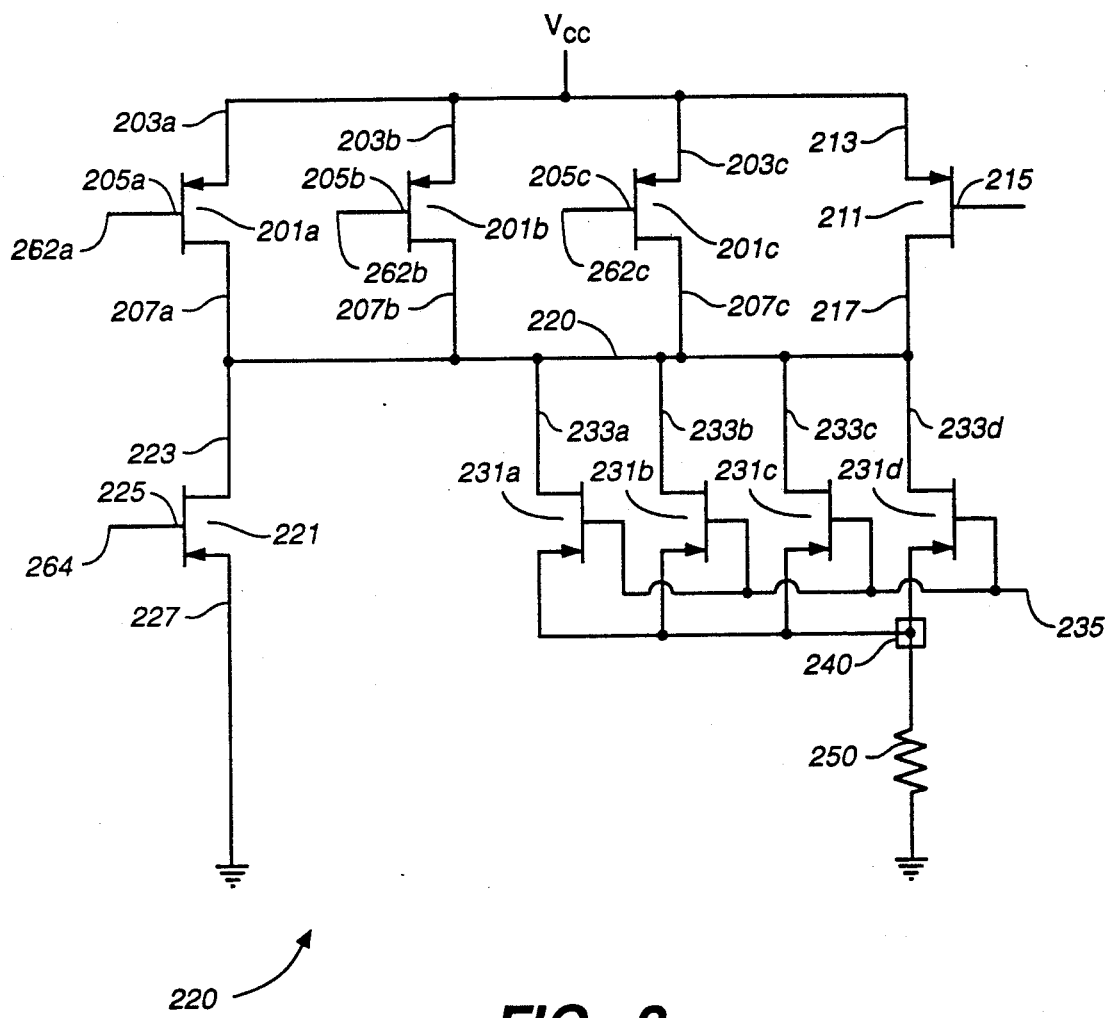
FIG._2

CMOS CURRENT STEERING CIRCUIT

BACKGROUND OF THE INVENTION

1. Field of the Invention

The present invention generally relates to CMOS current steering circuits.

2. State of the Art:

It is well known to use current steering circuits for supplying and selectively directing current quantities to one or more outputs. Typically, a current steering circuit has a first stage for supplying a constant current, and a second stage—usually comprising two transistors in parallel—for steering the constant current. In operation of such current steering circuits, a pre-determined bias is applied to one of the transistors and the conductivity of the other transistor is controlled so that current is steered (i.e., routed) through the transistor that exhibits the highest conductivity. In conventional current steering circuits, regardless of where the second stage routes the current, the current drawn by the circuit is substantially constant.

Current steering circuits, as implemented in CMOS technology, are often designed for use in battery-operated applications. For example, such circuits are often used in battery-operated laptop computers. Because such current steering circuits have the above-mentioned characteristic of drawing the same quantity of current whether or not the current is needed by the applications hardware, the circuits unnecessarily reduce the operative time of the batteries.

SUMMARY OF THE INVENTION

The present invention generally provides a circuit for steering current to a selected output while drawing only a minimal, idling current when no current is required at the output. In other words, the circuit of the present invention avoids drawing high current when such current is not required by the applications hardware, thus conserving the batteries that energize the applications hardware.

Broadly speaking, the circuit of the present invention comprises two first stage transistors that have their respective inputs and outputs in parallel, one configured to constantly supply a minimal idling current, and the other being controllable and able to supply a higher, powering current on request. The outputs of these two first stage transistors are connected together and connected to the inputs of two second stage transistors. The second stage transistors also have their respective inputs and outputs in parallel and act to route, i.e. steer, current to a selected output of a second stage transistor. In the second stage, a predetermined bias is applied to a control input of one of the transistors and a controllable bias is applied to a control input of the other transistor. The second stage controllable bias allows control of the conductivity of that transistor and because the two second stage transistors are essentially in parallel, changing the conductivity of one serves to substantially route the flow of current from the first stage through the second stage transistor exhibiting higher conductivity.

In the circuit of the present invention, the outputs of the first stage transistors and the inputs of the second stage transistors are connected at a node. The idling current helps to maintain the node at a constant voltage. The circuit draws high currently only when the first stage supplies the higher current. The invention conserves current at other times.

The method of the present invention for controlling an electric current broadly includes the steps of generating an idling current, controllably generating a powering current and electrically connecting the idling and powering currents to the inputs of a current routing, i.e., steering, device. The routing device preferably has at least two current paths and allows for control of the conductivity of the paths relative to each other. Further in the method of the present invention, the generation of the powering current is correlated with the conductivity of the current paths in the current routing device to substantially allow conductivity through a selected path. The method allows high current to be directed to a particular second stage transistor output by correlating the relative conductivity of the current path leading to that output with the generation of the powering current.

BRIEF DESCRIPTION OF THE DRAWINGS

The present invention can be further understood with reference to the following description in conjunction with the appended drawings, wherein like elements are provided with the same reference numerals. In the drawings:

FIG. 1 is schematic diagram of one embodiment of a circuit according to the present invention; and FIG. 2 is schematic diagram of another embodiment of a circuit according to the present invention.

DETAILED DESCRIPTION OF THE PREFERRED EMBODIMENTS

A first preferred embodiment of the present invention is shown in FIG. 1. In all preferred embodiments of the circuit of the present invention, the circuit is implemented on a single integrated circuit, preferably silicon, utilizing a CMOS fabrication process. Further, it is preferred that each transistor be a p-channel MOS transistor.

In the current steering circuit 100 of FIG. 1, the first stage of the circuit comprises a first powering transistor 101 and a first idling transistor 111. Normally, the first idling transistor's source 113 is connected to a constant voltage source ($V_{cc}$), typically 5 volts, and its gate 115 is connected to a substantially constant (non-zero) bias voltage. Therefore, first idling transistor 111 normally provides substantially constant idling current through its drain 117.

Further in the current steering circuit of FIG. 1, first powering transistor 1011 preferably receives the constant voltage $V_{cc}$ at its source 103 and a variable control input signal on its gate 105. Gate 105 is connected to node 162. In practice, the control signal at node 162 is preferably either at the same potential as gate 115 or at $V_{cc}$. In the former case, the transistor conducts current through to its drain 107; in the latter case, the transistor does not substantially conduct current through drain 107. Drains 107 and 117 of powering and idling transistors 101 and 111, respectively, are connected at node 120. The first stage maintains node 120 at a substantially constant voltage and reduces the need for repetitively charging and discharging the node which would slow the response time of circuit 100.

Node 120 is also connected to sources 123 and 133 of second stage idling transistor 121 and second stage powering transistor 131, respectively. Gate 135 of second stage powering transistor 131 is connected to node 165 which is connected to a substantially constant intermediate bias voltage; the intermediate bias voltage preferably being between ground and $V_{cc}$. Gate 125 of second stage idling transistor 121 is connected to node 164.

In the operation of circuit 100, the input signal at node 164 is preferably either substantially at ground potential or at a constant voltage $V_{cc}$. In the former case, transistor 121 conducts current from its source to its drain; in the latter case, transistor 121 does not conduct. When transistor 131 is conductive, transistor 121 is substantially non-conductive (i.e., the voltage at node 164 is substantially at $V_{cc}$). Under these conditions, the current from the first stage transistors 101 and 111 is steered primarily through transistor 131. The drain of transistor 131 is connected to node 140 and, typically, node 140 is connected via resistor 150 to ground. Therefore, in a typical configuration, the output voltage of the current steering circuit is established across resistor 150.

When the input signal at node 164 approaches ground, there is substantial conductivity through transistor 121 and current flow from the first stage will typically be directed through transistor 121 to ground via source 127 rather than through transistor 131. Under these conditions the current to node 140 is negligibly small.

Biasing of nodes 162 and 164 is typically controlled by external circuitry which is responsive to the requirements of the hardware application employing the circuit.

In the first preferred embodiment, idling transistors 111 and 121 are capable of conducting substantially the same level co current. Powering transistors 101 and 131 are capable of conducting greater current than idling transistors 111 and 121. By correlating input signal at nose 162 and 164, a substantial current saving can be realized over the prior art because circuit 100 need only draw high current when such current is required at node 140.

When current to output node 140 is desired to be substantially zero, the input signal at node 162 is substantially at $V_{cc}$ and the current from the first stage is the low, idling current through idling transistor 111. Further, the input signal at node 164 is substantially at ground and the idling current from the first stage is substantially routed through transistor 121. As discussed earlier, the voltage at node 120 remains substantially constant.

When current is required at output node 140, external circuitry is used to set the input voltage at node 162 to approximately the voltage level at node 115 and the input voltage at node 164 to approximately $V_{cc}$. Thus, substantially all current from first stage transistors 101 and 11 flows through powering transistor 31 to output node 140.

A second preferred embodiment is similar to the first except the bias on the gate of the second stage idling transistor is a constant intermediate voltage and the bias on the gate of the second stage powering transistor is controllable and is preferably either substantially at ground potential or at $V_{cc}$. In this embodiment, current flows through the output of the second stage power transistor when its controllable bias signal approaches ground.

Another embodiment of the present invention is circuit 200 as shown in FIG. 2. In this embodiment, first stage powering transistors 201a, 201b, 201c and 211 comprise the first stage and transistors 221, 231a, 231b, 231c and 231d comprise the second stage. Transistors 201a, 201b, 201c, and 211 preferably receive on the substantially constant voltage $V_{cc}$ on their sources 203a, 203b, 203c, and 213, respectively. Idling transistor 211 is biased by a substantially constant (non-zero) bias voltage on its gate 215 allowing a substantially constant current to be maintained through its drain 217. Powering transistors 201a, 201b and 201c are controlled respectively by control signals applied to nodes 262a, 262b, and 262c connected respectively to gates 205a, 205b, and 205c of the powering transistors. The drains of transistors 201a, 201b, and 201c, 207a, 207b, and 207c, respectively, and drain 217 are all connected at node 220. The first stage maintains node 220 at a substantially constant voltage and reduces the need for repetitively charging and discharging the node which would slow the response time of circuit 200.

Node 220 is also connected to sources 223, 223a, 233b, 233c, and 233d of second stage idling transistor 221 and second stage powering transistors 231a, 231b, 231c, and 231d, respectively. The gates of transistors 231a, 231b, 231c, and 231d are preferably connected together and connected to node 235. Node 235 is connected to a substantially constant intermediate bias voltage; the intermediate bias voltage preferably being between ground and $V_{cc}$. Gate 225 of second stage idling transistor 221 is connected to node 264.

The control signals, i.e., bias applied to nodes 262a, 262b, 262c, and 264 are preferably controlled by external circuitry which is responsive to the requirements of the hardware application utilizing the circuit.

When no current is required at output node 240, input signals at nodes 262a, 262b, and 262c or substantially at $V_{cc}$ and current flow from the first stage is mostly the low, idling current through transistor 211. Under these conditions, the idling current from the first stage is steered substantially through transistor 221 whose input voltage at node 264 is substantially at ground and current flows through source 227 of transistor 221.

When current is needed at output node 240, current may be supplied in discrete quantities. Control signals 262a, 262b, and 262c may individually, collectively, or in any combination approach ground to increase current flow from the first stage. When the external circuitry causes the first stage to supply more than idling current to the second stage, the external circuitry also causes the control signal on node 264 to approach $V_{cc}$. This steers the current from the first stage through transistors 231a, 231b, 231c, and 231d and thus steers the current to output node 240.

In a typical configuration, the output voltage of circuit 200 is installed across an external circuit element such a resistor 250.

In circuit 200, each transistor is capable of conducting the same quantity of current as the others. Therefore, in operation, the transistors in the second stage which are conducting current from the first stage must be capable of conducting the quantity of current supplied by the first stage. For example, when signals 262a, 262b and 262c all approach ground and signal 264 approaches $V_{cc}$, current from all four first stage transistors must be handled by the conducting second stage transistors (231a, 231b, 231c, and 231d). Of course, the external circuitry may determine, for example, that only the current from two first stage powering transistors in addition to the idling current is required at node 240. Under these circumstances, only two of the three input signals on nodes 262a, 262b, and 262c will approach ground. The signal on node 264 will approach $V_{cc}$ and the current from the first stage will be routed through the second stage powering transistors. In this example, the second stage will be capable of handling more current than is being supplied by the first stage.

In yet another embodiment of the present invention, each first stage transistor and the second stage idling transistor each conduct the same quantity of current. The second stage powering transistor conducts the maximum quantity of current able to be output from the first stage. This embodiment operates in substantially the same manner as the circuit shown in FIG. 2, except that transistors 231a, 231b, 231c and 231d are replaced by a single transistor capable of conducting the full first stage current (i.e., idling current plus current from all first stage powering transistors).

In still another embodiment, the circuit of FIG. 2 is used as a digital-to-analog converter. In this embodiment, input signals at nodes 262a, 262b and 262c represent digital values 1 (voltage approaching ground or 0 (voltage approaching $V_{cc}$), and circuit 200 sums these values at output node 240. For example, with input signals at node 262a, set to 1 and signals at nodes 262b and 262c set to 0, and signal 264 approaching $V_{cc}$, the current at output node 240 will represent the value 1. When the input voltage at gate node 262b is changed to represent the value 1, current will flow through transistor 201b and that additional current will appear at output node 240. Similarly, when input signal at node 262c is also changed to represent the value 1 current will flow through transistor 201c and this current will also be summed at output node 240.

This embodiment shows a digital-to-analog converter where only the idling current through transistor 211 is constantly drawn by the circuit and higher current draws are avoided until the sum of the digital values, i.e., the input signals on nodes 262a, 262b, and 262c, requires the higher current level at the output. In a battery operated device, digital-to-analog converters utilizing the above-described circuits can avoid high current consumption when the converters are merely idling and when less than maximum current is required at the converter's output.

The number of powering transistors is not limited. Thus, powering transistors 201a, b, c, d, e ... and powering transistors 231a, b, c, d, e, f ... may be implemented to configure a circuit capable of carrying increased current loads or offering increased resolution in converting digital signals to an analog current output. In these preferred embodiments, second stage powering transistors merely need be configured to accommodate the maximum current flow available from the first stage.

In another preferred embodiment of the present invention, the number of first stage powering transistors may be increased (e.g., 201a, b, c, d, e ... ) and the second stage need only be configured with an idling transistor and a single powering transistor where the powering transistor is able to conduct the full current the first stag is capable of supplying.

The foregoing has described the principles, preferred embodiments and modes of operation of the present invention. However, the invention should not be construed as limited to the particular embodiments discussed. For example, it will be evident to those skilled in the art that n-type transistors ma be substituted for the above-discussed p-type transistors, that fabrication processes other than CMOS may be used, that semiconductor materials other than silicon may be employed to implement the present invention, that the invention need not be implemented on a single integrated circuit, and that MOS devices need not be used. Accordingly, the above-described embodiments should be regarded as illustrative rather than restrictive, and it should be appreciated that variations may be made in those embodiments by workers skilled in the art without departing from the scope of the present invention as defined by the following claims.

What is claimed is:

1. A current steering circuit comprising:
   a first powering device having an input, an output and a control input;
   a second powering device having an input and an output;
   a first idling device having an output;
   a second idling device having an input, an output and a control input;
   the first idling device output, the first powering device output, the second idling device input and the second powering device input being electrically connected;
   means for introducing a voltage to the first powering device input;
   means for introducing a first controllable bias voltage to the first powering device control input to allow control of current output from the first powering device;
   means for introducing a second controllable bias voltage to the second idling device control input to allow control of conductivity through the second idling device; and
   the first idling device being configured to output a substantially constant current.

2. The circuit of claim 1, wherein the first powering device is configured to controllably allow greater current conduction than the first idling device and the second idling device is configured to controllably allow less current conduction than the second powering device 3. The circuit of claim 1, wherein each powering device comprises a plurality of transistors electrically connected in a parallel circuit configuration.

4. The circuit of claim 3, wherein the transistors are MOS transistors.

5. The circuit of claim 1, wherein the first idling device output is maintained at a substantially constant voltage level.

6. The circuit of claim 1, wherein the circuit is implemented in a single integrated circuit.

7. The circuit of claim 1, wherein the first and second controllable bias voltages are correlated to allow conductivity through the first powering device when substantially restricting conductivity through the second idling device.

8. The circuit of claim 1, wherein the first and second controllable bias voltages are correlated to substantially restrict conductivity through the first powering device when allowing conductivity through the second idling device.

9. A current steering circuit comprising:
   a first powering device having an input, an output and a control input;
   a second powering device having an input, an output and a control input;
   a first idling device having an output;
   a second idling device having an input and an output;

the first idling device output, the first powering device output, the second idling device input and the second powering device input being electrically connected;

means for introducing a voltage to the first powering device input;

means for introducing a first controllable bias voltage to the first powering device control input to allow control of current output from the first powering device;

means for introducing a second controllable bias voltage to the second powering device control input to allow control of conductivity through and current output from the second powering device; and the first idling device being configured to output a substantially constant current.

10. The circuit of claim 9, wherein the first and second controllable bias voltages are correlated to allow conductivity through the first powering device when allowing conductivity through the second powering device.

11. A current steering circuit comprising:

a plurality of first stage powering devices, each having an input, an output and a control input;

a plurality of second stage powering devices, each having an input and an output;

a first idling device having an output;

a second idling device having an input, an output and a control input;

the first idling device output, each first powering device output, the second idling device input and each second powering device input being electrically connected;

means for introducing a voltage to each first powering device input;

a plurality of first stage controllable bias voltage sources, each corresponding to at least one first stage powering device, being configured to introduce each first stage controllable bias voltage to each corresponding first stage powering device control input to allow control of current output from each first stage powering device;

means for introducing a second stage controllable bias voltage to the second idling device control input to allow control of conductivity through the second idling device; and the first idling device being configured to output a substantially constant current.

12. A current steering circuit comprising:

a plurality of first stage powering transistors, a plurality of second stage powering transistors, a first idling transistor and a second idling transistor, each transistor having an input, an output and a control input;

the first idling transistor output, each first stage powering transistor output, the second idling transistor input and each second stage powering transistor input being electrically connected;

means for introducing a voltage to each first powering transistor input;

means for introducing a voltage to the first idling transistor input;

means for introducing a bias voltage to the first idling transistor control input;

a plurality of means corresponding to the plurality of first stage powering transistors for introducing a first stage controllable bias voltage to each corresponding first stage powering transistor control input;

means for introducing a second stage controllable bias voltage to the second idling transistor; and means for introducing a bias voltage to each second stage powering transistor control input.

13. A method of controlling electric current in an electronic circuit comprising the steps of:

generating an idling current;

generating a controllable powering current;

electrically connecting the idling and powering currents to an input of a current routing device having a first controllably conductive current path and a second current path;

correlating the generation of the powering current with the conductivity of the first current path to substantially allow conductivity through the first path during generation of the powering current and to substantially inhibit conductivity through the first path during non-generation of the powering current.

14. The method of claim 13, wherein the idling current is substantially constant.

15. The method of claim 13, wherein the powering current is greater than the idling current.

* * * * *

UNITED STATES PATENT AND TRADEMARK OFFICE
CERTIFICATE OF CORRECTION

PATENT NO. : 5,179,292
DATED : January 12, 1993
INVENTOR(S) : Lee

It is certified that error appears in the above-identified patent and that said Letters Patent is hereby corrected as shown below:

Column 2, line 51, delete [1011] and insert --101--.

Column 3, line 33, delete [co] and insert --of--.

Column 3, line 36, delete [nose] and insert --nodes--.

Column 3, line 36, delete [saving] and insert --savings--.

Column 3, line 54, delete [11] and insert --111--.

Column 3, line 54, delete [31] and insert --131--.

Column 5, line 20, following the word ground, insert --)--.

Column 5, line 65, delete [ma] and insert --may--.

Signed and Sealed this

Twenty-fifth Day of January, 1994

Attest:

BRUCE LEHMAN

Attesting Officer     Commissioner of Patents and Trademarks